(12) United States Patent
Kuenemund

(10) Patent No.: US 7,898,842 B2
(45) Date of Patent: Mar. 1, 2011

(54) MEMORY FOR STORING A BINARY STATE

(75) Inventor: Thomas Kuenemund, Munich (DE)

(73) Assignee: Infineon Technologies AG, Neubiberg (DE)

( * ) Notice: Subject to any disclaimer, the term of this patent is extended or adjusted under 35 U.S.C. 154(b) by 304 days.

(21) Appl. No.: 12/106,640

(22) Filed: Apr. 21, 2008

(65) Prior Publication Data

US 2009/0323439 A1    Dec. 31, 2009

(51) Int. Cl.
*G11C 11/00* (2006.01)
(52) U.S. Cl. ............. 365/154; 365/189.14; 365/190
(58) Field of Classification Search ......... 365/154, 365/189.14, 190
See application file for complete search history.

(56) References Cited

U.S. PATENT DOCUMENTS

| 6,154,384 | A  | * | 11/2000 | Nataraj et al. ......... 365/49.15 |
| 6,496,399 | B1 |   | 12/2002 | Choi et al. |
| 6,646,900 | B2 | * | 11/2003 | Tsuda et al. .......... 365/49.17 |
| 6,760,241 | B1 |   | 7/2004  | Gharia |
| 6,845,025 | B1 |   | 1/2005  | Nataraj |
| 7,154,764 | B2 |   | 12/2006 | Nataraj |
| 2008/0205169 | A1 | | 8/2008 | Kuenemund et al. |

* cited by examiner

*Primary Examiner*—Hoai V Ho
(74) *Attorney, Agent, or Firm*—Dickstein Shapiro LLP

(57) ABSTRACT

A memory cell for storing a binary state, the memory cell being adapted for storing a binary state based on a write indication and a binary write masking value and for storing a complementary binary state based on the write indication and a complementary binary write masking value.

7 Claims, 7 Drawing Sheets

MEMORY FOR STORING A BINARY STATE

BACKGROUND OF THE INVENTION

The invention relates to a device for storing a binary state as it may occur in the field of memories for security applications for example.

Computer systems can make use of processing units as, for example, micro-processors or micro-controllers, often also called CPUs (CPU=Central Processing Units). Such a unit can be located in a data path, to which a number of functional units of a system may be connected to in order to enable data processing. A conventional concept is to use data buses, i.e. defined sets of connection lines, to connect functional entities as, for example multiplexers, ALUs (ALU=Arithmetic Logic Unit), shifters and register files.

In order to provide an example, in the following a register file will be illuminated. A register file serves as an intermediate memory or storage device for address data and payload data, which are participating in a currently processed operation by, for example, a CPU. A register file can therewith also be seen as a clipboard memory. A register file can enable a fast, random and simultaneous access on data, for example, for two ALU operands. Accessing said data can be referring to reading as well as to writing operations, where also simultaneous read and write operations may be carried out.

Register files may provide so-called write back-ports which can e.g. serve to write back intermediate results from ALU processing operations. Moreover, register files may serve for loading or to move out address or payload data from the register file, wherein the reading/writing ports may also serve for communicating with other components of a system outside the CPU data path.

In order to save on energy consumption and chip area, register files are often implemented as so-called multi-port RAMs (RAM=Random Access Memory). In these implementations, sets of bit line connections may connect registers, wherein the functional unit register may be defined as a set of similar one-bit-register cells with the properties provided above. The number of bits, which can be stored in a single data word register, is the so-called bitwidth of the data path. The number of ports corresponds to the maximum number of different accesses which can be carried out on the different registers simultaneously.

Differential power analysis (DPA) is a commonly known method for attacking integrated circuits of security applications, in order to determine confidential information as, for example, passwords or cryptographic keys. For a given program code, respectively given algorithm, statistical methods serve to measure power profiles, respectively determining integrated values on a changing charge across several clock cycles, wherein a correlation between systematic data variation and the corresponding statistical values, allows to conclude on the actually protected information.

One concept to combat DPA is the so-called one-time-pad encryption. In order to prevent DPA, or at least in order to make it more difficult, data which is exchanged between subsystems of an integrated circuit, is encrypted. Here, one-time-pad-encryption is often used for its proven high security. Binary coded clear texts $m=(m_1, m_2, \ldots)$ are encrypted with keys $k=(k_1, k_2, \ldots)$ determined from true random sequences (e.g. 1001 1000 1011) according to $c=e(k,m)=(k_1 \oplus m_1, k_2 \oplus m_2, \ldots)$ i.e., a bit $c_j$ of a cipher text $c=e(m,k)$ is determined by an XOR-operation $k_j \oplus m_j$ of the corresponding bits of the key k and the clear text m. Since $k \oplus k=0$ and $0 \oplus k=k$ yields $k_j \oplus c_j=m_j$, which is the decryption of c, in order to re-determine clear text m, again using a bit-wise XOR operation. The one-time cryptosystem may use each encryption key only once, since otherwise statistical methods may be used in order to determine information on the clear text.

Another conventional concept is the so-called dual-rail implementation. In order to prevent DPA, integrated circuits are implemented in a way that they provide the same power profile independently from the processed data. In the ideal case power profiles always are identical. For a single rail data path implementation the power profile is not predetermined. Therefore, the temporal power profile, representing the states of the circuit and the respective integrated charges, depends on the nodes, respectively electrical capacities, which change their potential, i.e., for which charge is transferred. Therefore, the power profile has a strong dependency on the temporal variance of the payload data.

Dual rail implementation addresses the problem of variable integral charges, using the so-called dual rail logic. Starting from the conventional single rail logic, in which any bit within the data or signal path has a physical representation of one electrical node k of a circuit, the dual rail logic represents any bit with two nodes k and kq, wherein said bit provides a valid logical value, if k corresponds to the true logical value of the value b of said bit and kq represents the complementary value bq=!b.

The desired invariants of the integrated charges are achieved, by introducing an intermediate or pre-charge state between each two states having valid logical values $(b,bq)=(1,0)$ or $(0,1)$. Within the intermediate or pre-charge state, k as well as kq is charged to the same potential, i.e., representing logically invalid values $(1,1)$ or $(0,0)$. For the precharge state $(1,1)$ a sequence of states could, for example, be $(1,1) \rightarrow (0,1) \rightarrow (1,1) \rightarrow (1,0) \rightarrow (1,1) \rightarrow (1,0) \rightarrow (1,1) \rightarrow (0,1) \rightarrow \ldots$ For each arbitrary sequence of such states, when transferring from a pre-charge state $(1,1) \rightarrow (b,bq)$ exactly one node is charged from 1-state to 0-state, and for all states $(b,bq) \rightarrow (1,1)$ exactly one node is charged from the 0-state to the 1-state, independently from the logical valid value b of the bit. For the intermediate state or pre-charge state $(0,0)$ a similar evaluation can be carried out. Consequently, the integral charges of such state sequences are independent from the sequence of $(b,bq)$ of the logically valid values, for as long as the nodes k and kq have similar electrical capacities. The power profile of the implemented data path does not depend on the temporal variation of the processed data, thus it is DPA resistant.

Other known attacks are the so-called EMA (Electro Magnetic Analysis) and probing (invasive eavesdropping). As mentioned above, the dual rail implementation may help securing significant parts of the address respectively data paths, by introducing neutral circuits in order to prevent short term pulses on signal paths which are evoked by propagation time differences, also called glitches, which may determine another, at least theoretic, DPA risk. Another concept for advancing security maybe secure wiring, where critical signal paths, as for example word lines, are implemented in MOS-gate (MOS=Metal Oxide Semiconductor) polysilicon and "Metal One" in the wiring layer, bit lines may be implemented in "Metal One", etc. Another technique to combat attacks is to implement the integrated circuits as dense as possible, and use the vertical wiring in order to prevent probing and EMA, e.g. establishing a Faraday cage.

Other concepts are scrambling and interleaving of word or bit lines, as well as distributing them on several paths of RAM/RF cells (RF=Register File), further complicating the assignment of addresses and associated data. In some cases a possibility of randomly introduced bits may help securing the sequence of RAM/RF address respectively accesses on the data within an RAM/RF.

SUMMARY OF THE INVENTION

According to an embodiment the present invention comprises a memory cell for storing a binary state, the memory cell being adapted for storing a binary state based on a write indication and a binary write masking value and for storing a complementary binary state based on the write indication and the complementary binary write masking value.

BRIEF DESCRIPTION OF THE DRAWINGS

In the following, some embodiments are explained in greater detail referring to the accompanying drawings in which.

DETAILED DESCRIPTION OF THE INVENTION

Figure 1A:
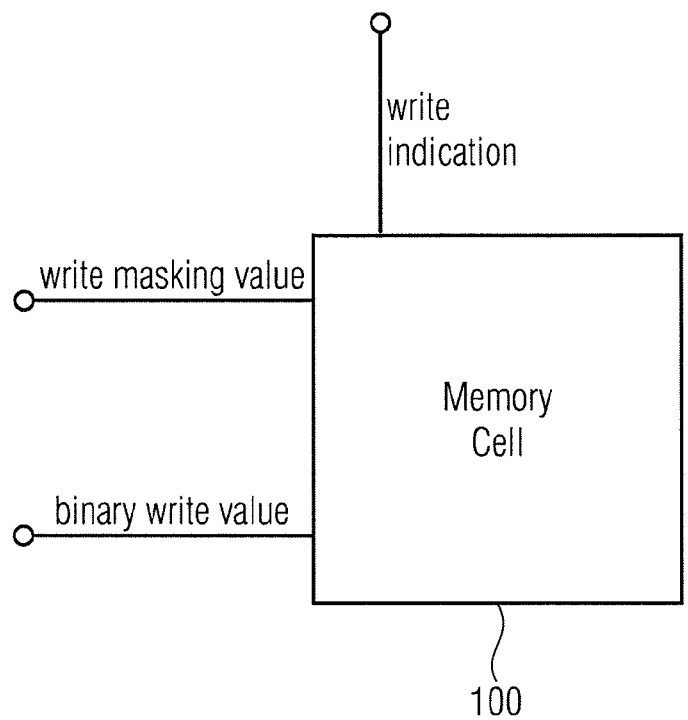
FIG. 1a is an embodiment of a memory cell.

FIG. 1a shows an embodiment of a memory cell 100 for storing a binary state, the memory cell 100 being adapted for storing a binary state based on a write indication and a binary write masking value and for storing a complimentary binary state based on the write indication and a complimentary binary write masking value.

Figure 1B:
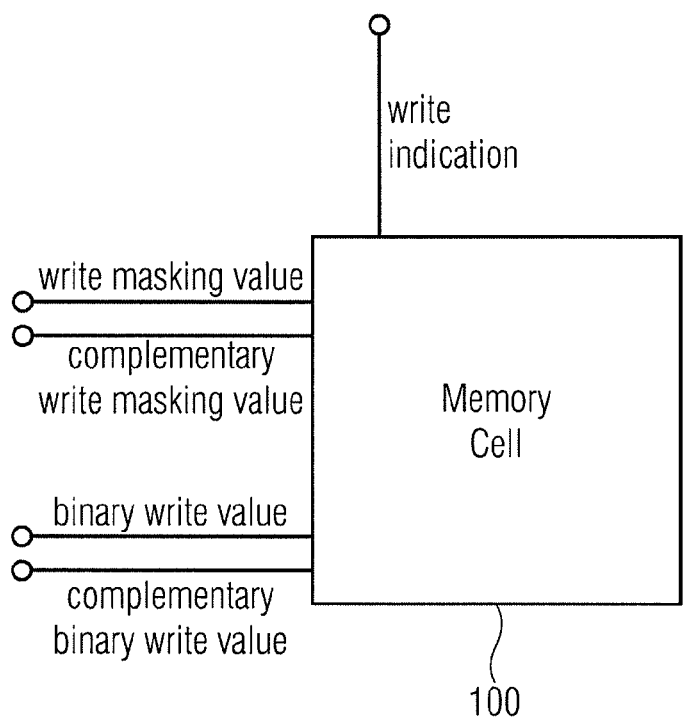
FIG. 1b is another embodiment of a memory cell.

FIG. 1b shows another embodiment of a memory cell 100. In the embodiment depicted in FIG. 1b, the memory cell 100 is adapted for receiving a binary write value defining the binary state and for receiving the complementary binary write value defining a complimentary binary state. Furthermore, in embodiments the memory cell 100 can be adapted for receiving the binary write masking value and a complimentary binary write masking value.

Figure 1C:
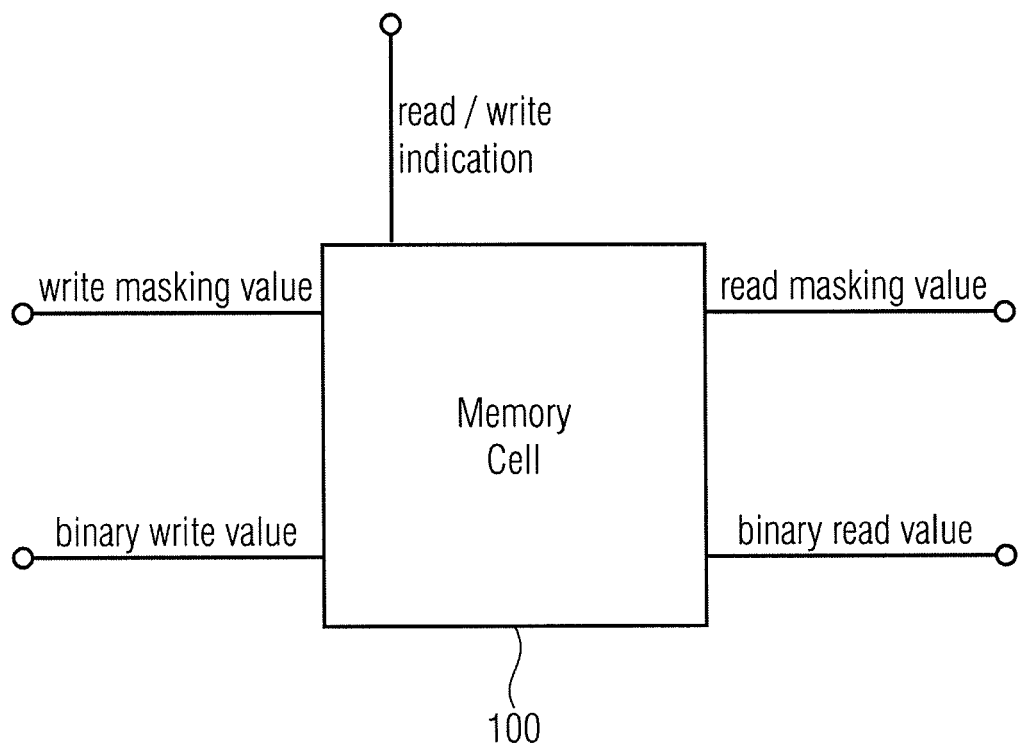
FIG. 1c is another embodiment of a memory cell.

Another embodiment of a memory cell 100 is shown in FIG. 1c. In the embodiment exhibited in FIG. 1c, the memory cell 100 is adapted for providing a binary read value defining the binary state based on a read indication and a binary read masking value, and for providing a complementary binary read value based on the read indication and a complementary binary read masking value.

Figure 1D:
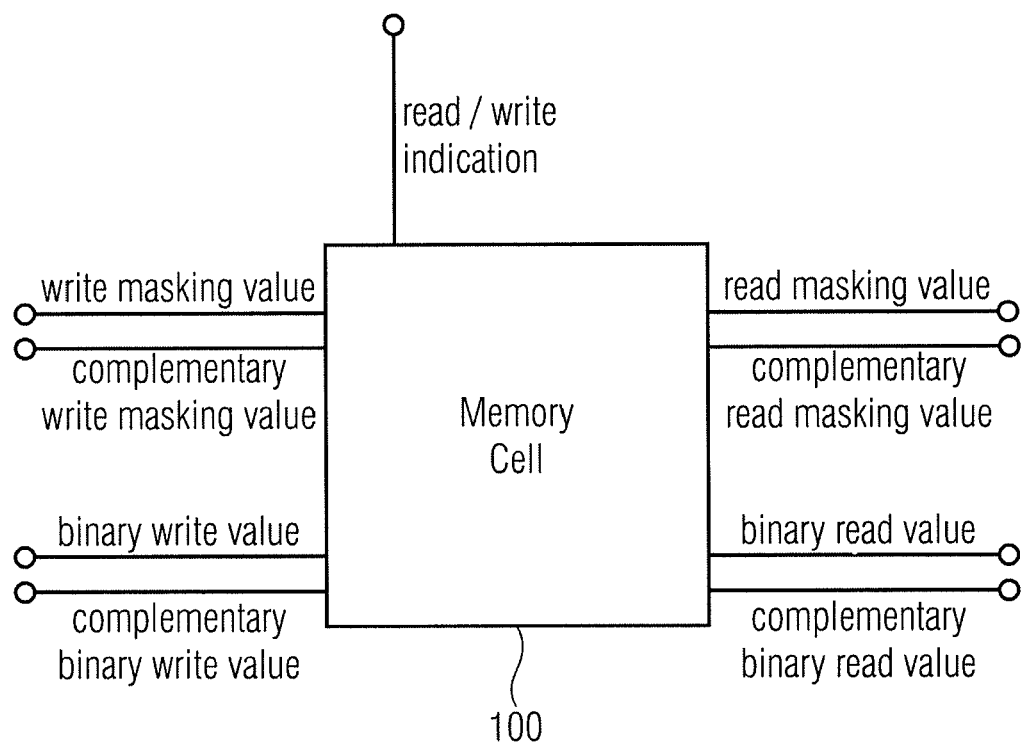
FIG. 1d is another embodiment of a memory cell.

Consequently, embodiments of the memory cell 100 may be adapted according to FIG. 1d. FIG. 1d shows a memory cell 100 being adapted for receiving a binary write value defining the binary state, a complementary binary write value, a binary write masking value and a complimentary binary write masking value. Moreover, the memory cell 100 shown in FIG. 1d is adapted for providing a binary read value, a complementary binary read value, to receive a read masking value and a complementary read masking value as well as a read indication.

The memory cells 100 as detailed above may comprise a RAM or a register file latch. Moreover, an embodiment of the memory cell 100 may comprise a switch coupled to a masking device, circuit or element, e.g. a masking transistor, the masking device, circuit or element determining the binary state based on the binary write masking value or the complimentary binary write masking value, wherein the switch is adapted for coupling the masking transistor, device, circuit or element, to the memory cell 100 or to another memory cell. The term switch refers to any device, circuit or element which is adapted for coupling and decoupling the masking device, circuit or element, e.g. masking transistor, to one or a plurality of memory cells. In embodiments several memory cells may be switched to the same masking device, circuit or element simultaneously. In the following a masking transistor will be considered in embodiments, however, generally, any masking device, circuit or element may replace the masking transistors considered in the embodiments.

Figure 1E:
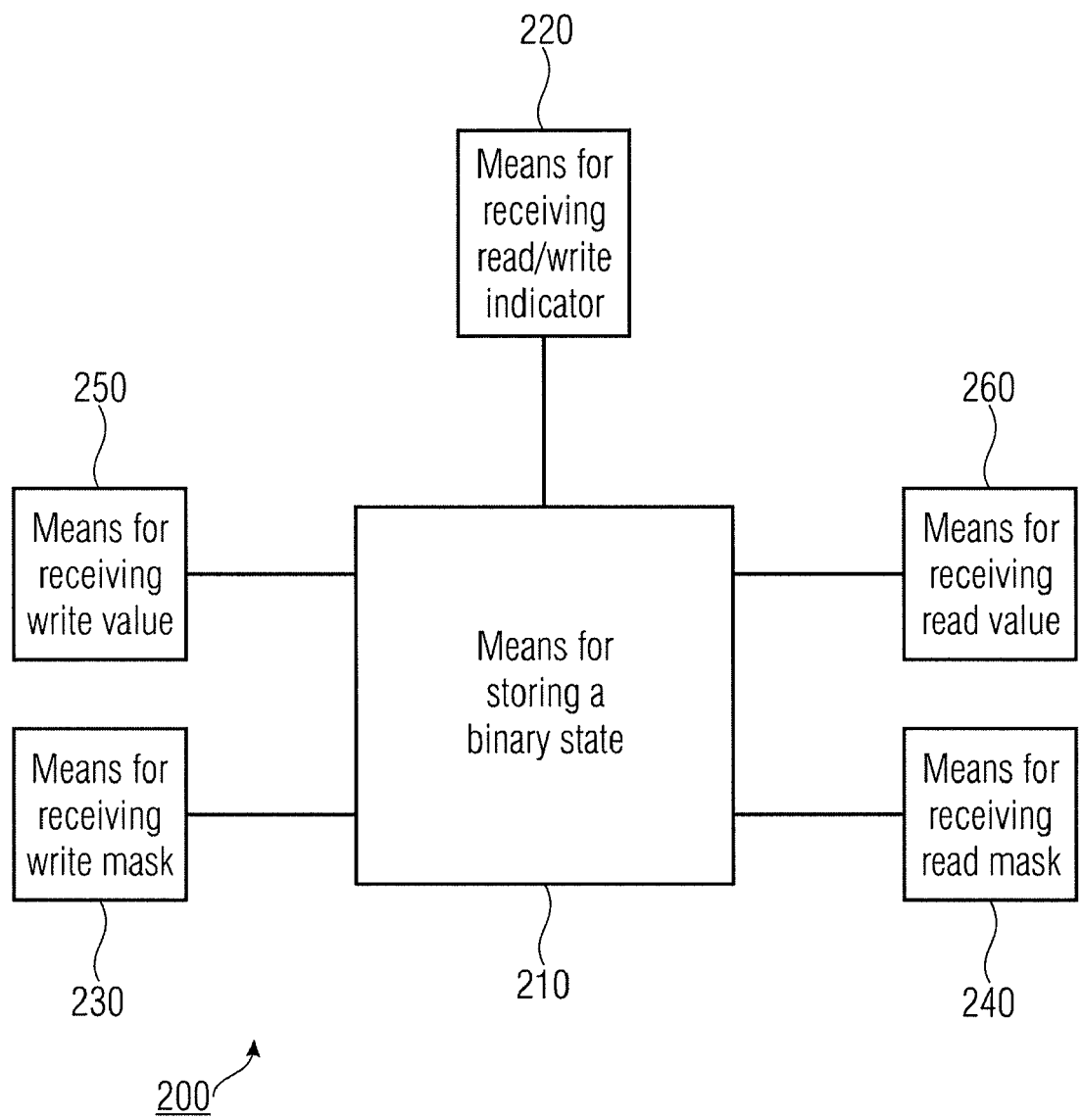
FIG. 1e shows an embodiment of a memory device.

FIG. 1e shows an embodiment of a memory device 200. The memory device 200 comprises a means 210 for storing a binary state, a means 220 for receiving a read/write indication, a means 230 for receiving a write mask, a means 240 for receiving a read mask, a means 250 for receiving a binary write value and a means 260 for providing a binary read value.

In embodiments the means 210 for storing can be adapted for storing the binary write value as a binary state when the means 220 for receiving the read/write indication receives a write indication and a means 230 for receiving the write mask receives a binary write masking value, and for storing a complementary binary value as binary state when the means 220 for receiving the read/write indication receives a write indication and the means 230 for receiving the write mask receives a complementary binary write masking value.

In embodiments the means 210 for storing can be adapted for providing the binary read value as binary state when the means 220 for receiving the read/write indication receives a read indication and the means 240 for receiving the read mask receives a binary read masking value, and for providing a complementary binary value as binary state when the means 220 for receiving the read/write indication receives a read indication and the means 240 for receiving the read mask receives a complementary binary read masking value.

The means 210 for storing can be adapted for storing a complementary binary state. The means 230 for receiving the write mask can be adapted for receiving a complementary write mask. The means 240 for receiving the read mask can be adapted for receiving a complementary read mask. The means 250 for receiving the binary write value can be adapted for receiving a complementary binary write value. The means 260 for providing the binary read value can be adapted for providing a complementary binary read value.

In embodiments the means 210 for storing may comprise a random access memory or a register file latch. In other embodiments the means 210 for storing the binary state can be adapted for storing a plurality of binary states, the means 230 for receiving the write mask can be adapted for receiving write masks for the plurality of binary states and a means 240 for receiving the read mask can be adapted for receiving read masks for the plurality of binary states.

Furthermore, the means 210 for storing may comprise a plurality of memory cells and the means 230 may comprise a masking device, circuit or element, e.g. a masking transistor, wherein the masking device, circuit or element may be connectable to the plurality of memory cells. In embodiments, the masking device, circuit or element may be re-used for multiple memory cells as for example for 2, 4, or 8 memory cells. The masking device, circuit or element may be switched between the memory cells, where a switch may be utilized. The term switch refers to any device, circuit or element which is adapted for coupling and decoupling the masking device, circuit or element, e.g. masking transistor, to one or a plurality of memory cells. In embodiments several memory cells may be switched to the same masking device, circuit or element simultaneously. A switching transistor may be utilized.

In embodiments the means 210 for storing may comprise a plurality of memory cells and the means 240 for receiving the read mask may comprise a masking transistor, wherein the masking device, circuit or element, e.g. the masking transistor can be connectable to the plurality of memory cells. In embodiments, the masking device, circuit or element for carrying out the read masking may be re-used for multiple memory cells, as for example for 2, 4 or 8 memory cells. A switch may be used to switch the masking device, circuit or element to or between the plurality of memory cells. The term switch refers to any device, circuit or element which is adapted for coupling and decoupling the masking device, circuit or element, e.g. masking transistor, to one or a plurality of memory cells. A switching transistor may be utilized. In embodiments several memory cells may be switched to the same masking device, circuit or element simultaneously.

Figure 1F:
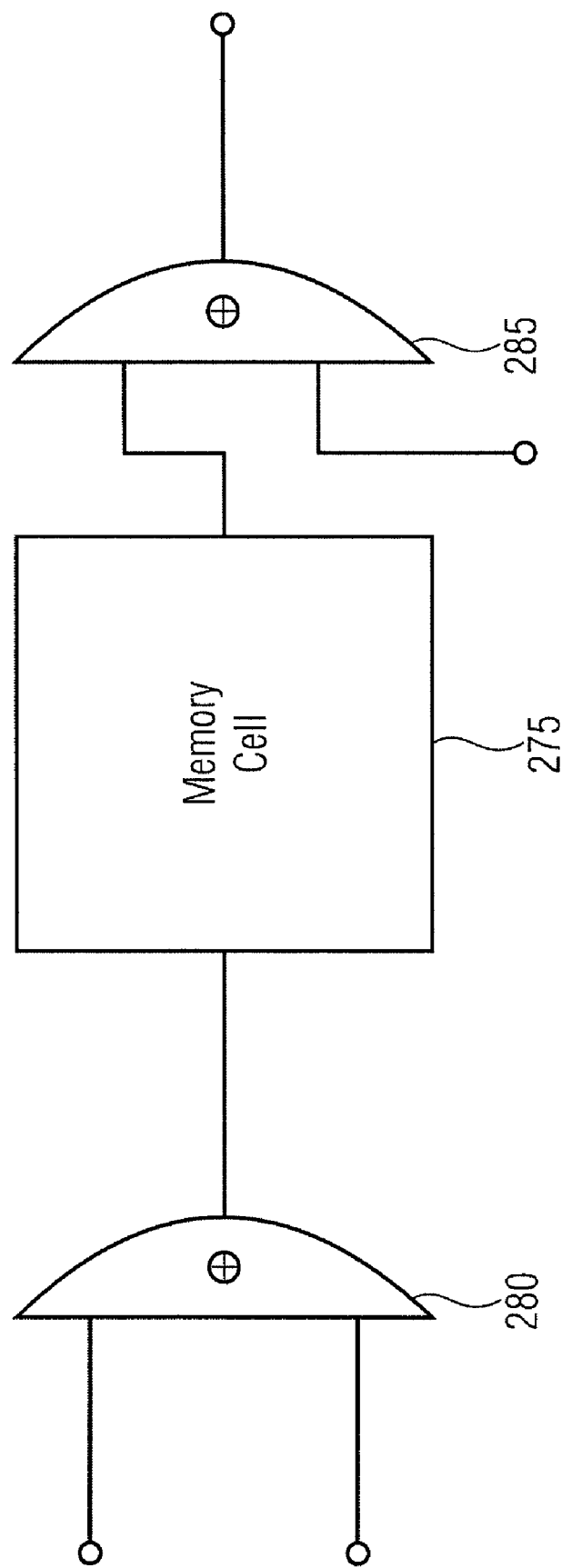
FIG. 1f shows an embodiment of a circuit.

FIG. 1*f* shows an embodiment of a circuit 270. The circuit 270 comprises a memory cell 275 with an input for a binary value and an output for the binary value.

The circuit 275 may further comprise a first XOR circuit 280 with an input for a write value, an input for a write masking value and an output coupled to the input for the binary value. Moreover, the circuit 275 may comprise a second XOR circuit 285 with an input coupled to the output for the binary value, an input for a read masking value and an output for a read value.

In embodiments, the circuit 275 may comprise a plurality of memory cells and the output of the first XOR circuit 280 may be connectable to a plurality of inputs of memory cells. In embodiments the output of the first XOR circuit 280 may be connectable to 2, 4 or 8 inputs of different memory cells. Another transistor may serve as a switch between the output of the first XOR circuit 280 and the input of the memory cells. In other embodiments the input of the second XOR circuit 285 may also be connected to a plurality of outputs of memory cells. The circuit 270 may be integrated in a random access memory or a register file latch. In other embodiments the circuit 270 may be integrated on one chip or one die.

Embodiments of the present invention may carry out a method for writing a binary value to a memory cell, comprising the steps of receiving the binary value, receiving a write indication, receiving a write masking value, combining the binary value and the write masking value according to an XOR operation to obtain a masked binary value and storing the masked binary value in the memory cell.

Embodiments may be used in memories with random access on masked data, so-called masked random access memory (mRAM) or mask register file (mRF) for security applications, i.e., mRAM/mRF being resistant to DPA, EMA and probing (invasive eavesdropping). The resistance can be achieved in embodiments by using a bit-wise XOR masking of all data with time variant one-time-pad masks for data transfer, as well as for data storage using short time static masks. In embodiments the XOR-circuits may be integrated in memory cells, such that a high security with low energy and area consumption may be combined. Some embodiments may even yield as high as possible security with a minimal energy and area consumption.

Embodiments may be integrated in a register file for masked data within a CPU for example a chip card controller with high security requirements. Register files for CPUs may utilize several independent read and/or write ports. In the following two more detailed embodiments will be considered, i.e. a masked single port RAM in FIG. 2 and a register file having both a write port and a read port in FIGS. 3*a* and 3*b*. Generally, embodiments are not limited to such configurations and can easily be generalized to a plurality of ports or various types of memories.

Multi-port SRAM (SRAM=Static RAM) macros may be used as full custom register file, for example, in the CPU core of security ICs (IC=Integrated Circuit), for storing masked data, wherein demasking and/or re-masking may be carried out in peripheral SRAM components rather than within memory cells according to embodiments. Other non-masked latch based implementations, for example using semi-custom standard cells, of register files can be found in standard microcontrollers. These concepts are disadvantageous in that they only have a limited or no resistance to DPA, EMA and probing.

Figure 2:
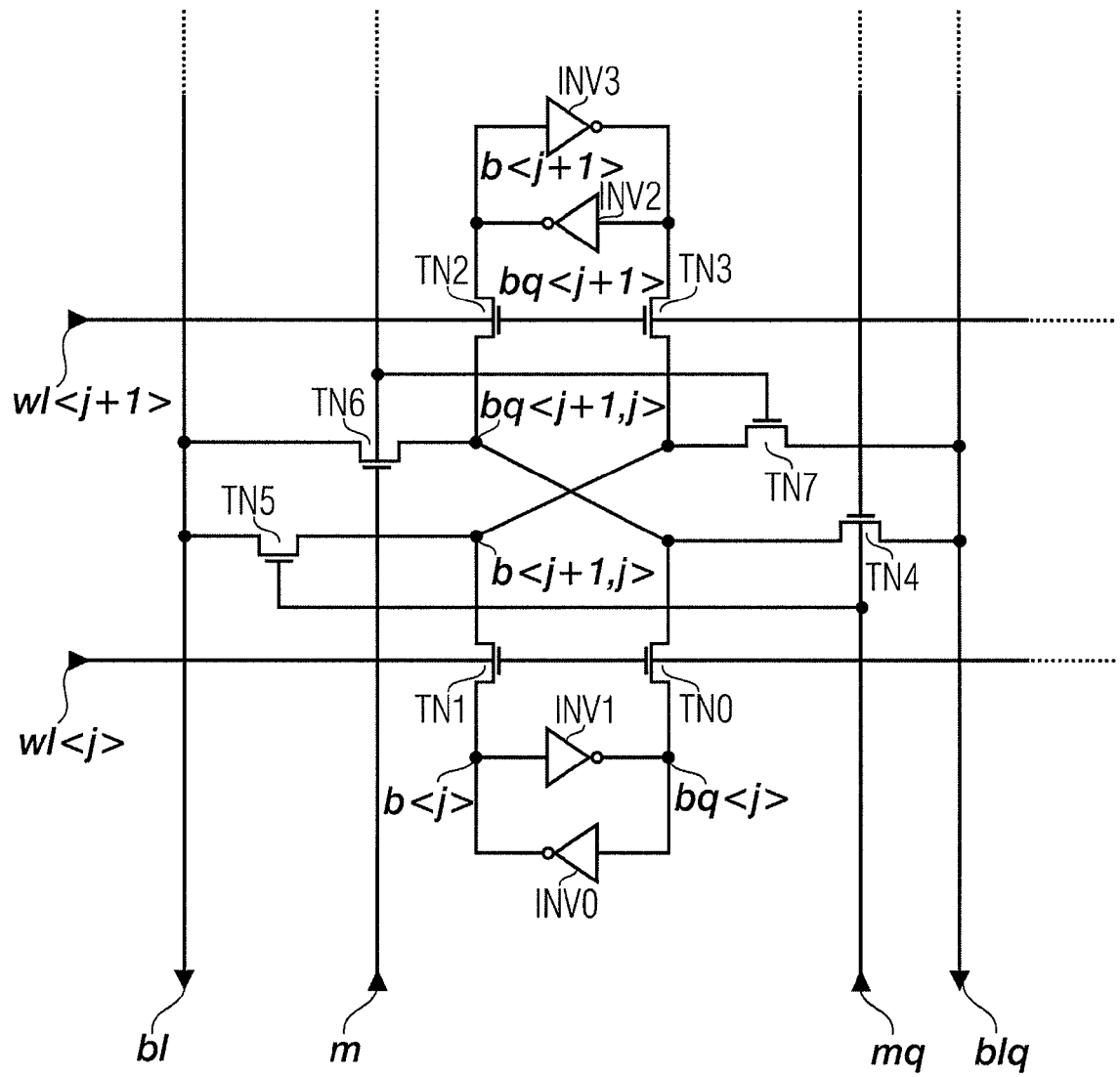
FIG. 2 shows an embodiment of a RAM cell for masked data.

In the following, implementation of an embodiment will be discussed in detail. FIG. 2 shows an embodiment of a RAM cell for masked data in a 6 transistor-SRAM configuration. Two memory cells are depicted in FIG. 2. One memory cell in FIG. 2 comprises one pair of inverters, INV3 and INV2, respectively INV1 and INV0. Moreover, two pairs of access transistors TN3, TN2 and TN1, TN0 together with the memory node pairs (b<j+1>, bq<j+1>) and (b<j>, bq<j>), where j=0 . . . M−1 denotes the position of a memory cell along a shared pair of bit lines (bl, blq) for M memory cells. The pairs of access transistors TN3, TN2 and TN1, TN0 are not directly coupled to the pair of bit lines blq and bl, but through n-channel transistors TN7, TN4 and TN6, TN5. The n-channel transistors are connected with the nodes b<j+1,j>, bq<j+1,j>, bl, blq, m and mq in a way that for complementary $$bq<j+1,j>=\overline{b<j+1,j>}, blq=\overline{bl} \text{ and } mq=\overline{m}$$

the XOR-function $$bl=b<j+1,j>, blq=bq<j+1,j> \text{ with}(m,mq)=(0,1), \text{ and}$$

$$bl=bq<j+1,j>, blq=b<j+1,j> \text{ with}(m,mq)=(1,0)$$

is realized. Consequently, during a write operation of (bl,blq) in one of the memory cells, i.e., wl<j+1> or wl<j> is set to positive power supply VDD (VDD, positive supply voltage, here VDD corresponds to a logical "1" state, however, in other embodiments it may correspond to a logical "0" state) and either TN3, TN2 or TN1, TN0 starts conducting, in a way that on (bl, blq) the OTP-transport-masked (OTP=One-Time-Pad) $m_t$ data $$(d \oplus m_t, \overline{d \oplus m_t})$$

are re-masked during the writing operation according to $$m=m_t \oplus m_s, mq=\overline{m_t \oplus m_s}$$

and $$(d \oplus m_t \oplus m, \overline{d \oplus m_t \oplus m}) = (d \oplus m_t \oplus m_s,$$
$$\oplus m_t \oplus m_t \oplus m_s) = (d \oplus m_s, \overline{d \oplus m_s})$$

for storage in the respective memory cell and being stored therein after switching off wl<j+1> or wl<j>, that is, setting the word lines to potential VSS (VSS, low supply voltage, here VSS corresponds to a logical "0" state, however, in other embodiments it may correspond to a logical "1" state).

As it is assumed in FIG. 2 m,mq represent the external XOR operation of the OTP-transport-mask $m_t$ with the storage mask $m_s$.

Similarly, when reading, i.e. wl<j+1> or wl<j> is set to power supply VDD, thus TN3, TN2 or TN1, TN0 are set to conductive state, stored masked data $$(d \oplus m_s, \overline{d \oplus m_s})$$

from (b<j+1>, bq<j+1>) or (b<j>, bq<j>)

are re-masked to $$(bl, blq) = (d \oplus m_t, \overline{d \oplus m_t})$$

through an XOR operation being carried out using the n-channel transistors TN7, TN4, respectively, TN6, TN5 according to $$m = m_t \oplus m_s, mq = \overline{m_t \oplus m_s}.$$

According to the above described embodiment, clear text representation of the data can be avoided in all processing states of the data, i.e. when writing data to a memory cell, when storing or holding data within the memory cell and when the data is read from the memory cells. The memory cells in the above mentioned embodiment may refer to RAM-cells.

Stored data, even though it may be masked using a storage mask $m_s$ maybe more sensitive to attacks, as it remains constant over a longer period of time. According to the above embodiment, data masked with $m_s$ is only existent within the memory/RAM cells themselves, wherein significant protection may be achieved through respective layout or circuit design options, i.e. within these memory cells. Data being transferred on the bit lines bl,blq may be masked with a frequently varying OTP mask $m_t$, rendering attacks significantly more difficult and requiring much more effort. Embodiments may achieve this effect by integrating the n-channel transistors TN7, TN4 respectively TN6, TN5 carrying out the XOR-function in any two consecutive RAM cells. Taking layout or circuit design options into account, such an XOR function for any two RAM-cells may be advantageous, whereas principally other relations or layouts are also conceivable. In addition, even higher numbers of RAM cells may be coupled to a pair of n-channel transistors, for example, one such XOR-function may be implemented for each 4 RAM-cells.

Figure 3A:
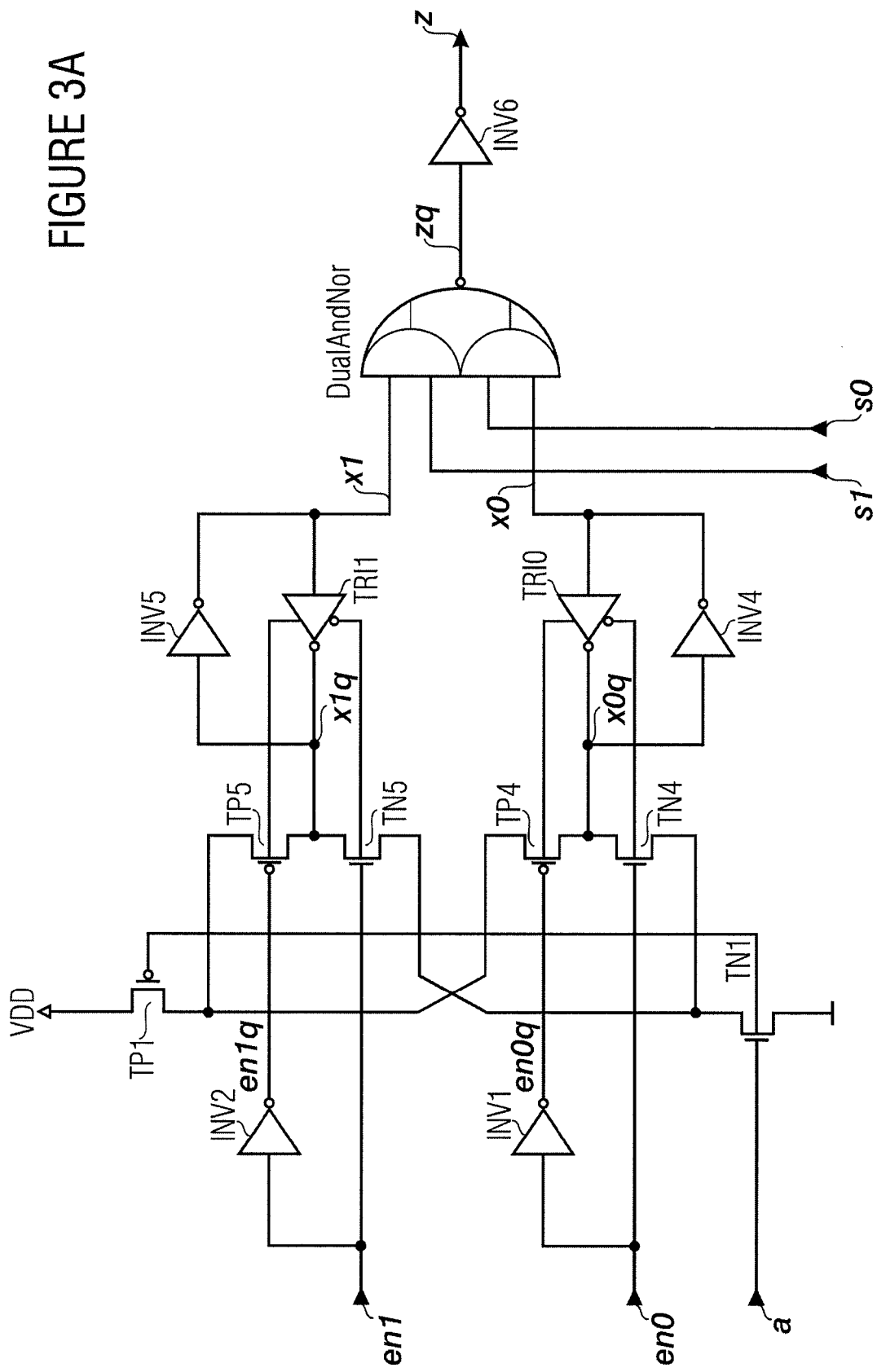
FIG. 3a shows a register file latch.

In the following another embodiment being implemented in a register file latch will be detailed. FIG. 3a shows a register file latch having two memory cells with separated write and read ports, where in this example one write and one read port is shown. Embodiments may utilize multiple read or write ports. The memory cells are implemented using two latches in a static CMOS-logic (CMOS=Complementary MOS), where the latches are realized using INV5, TRI1 respectively INV4, TRI0 with TP5, TN5 respectively TP4, TN4 realizing the write ports with the memory node pairs (x1, x1q) respectively (x0, x0q). Note, TRI0 and TRI1, and TRI generally, are tri-state inverters, i.e. aside from logical 0- and 1-states they can be operated in a third state in which their outputs adopt a high ohmic state. From FIG. 3a it can be seen that the writing operation within one memory cell can be enabled by the signals en0 and en1. en0 is coupled to the gate of TN4 and through inverter INV1 with the gate of TP4. Similarly, en1 is coupled to the gate of TN5 and through inverter INV2 with the gate of TP5. The data input a is coupled to the gate of transistor TN1 as well as TP1 which are coupled to VDD and VSS, respectively. So upon activation of either one of en1 or en0, TRI0 respectively TRI1 are deactivated and the two memory cells can take over the value of the complementary data a in x0q or x1q.

If data is read from one of the latches, i.e. from the memory node pairs (x1, x1q) or (x0, x0q) a DualAndNor-gate is used as multiplexer. The DualAndNor-gate takes two inputs s0 and s1 and in dependence on whether (s1,s0)=(1,0) or (s1,s0)=(0, 1) the value of either x1 or x0 is read through the inverter INV6.

Figure 3B:
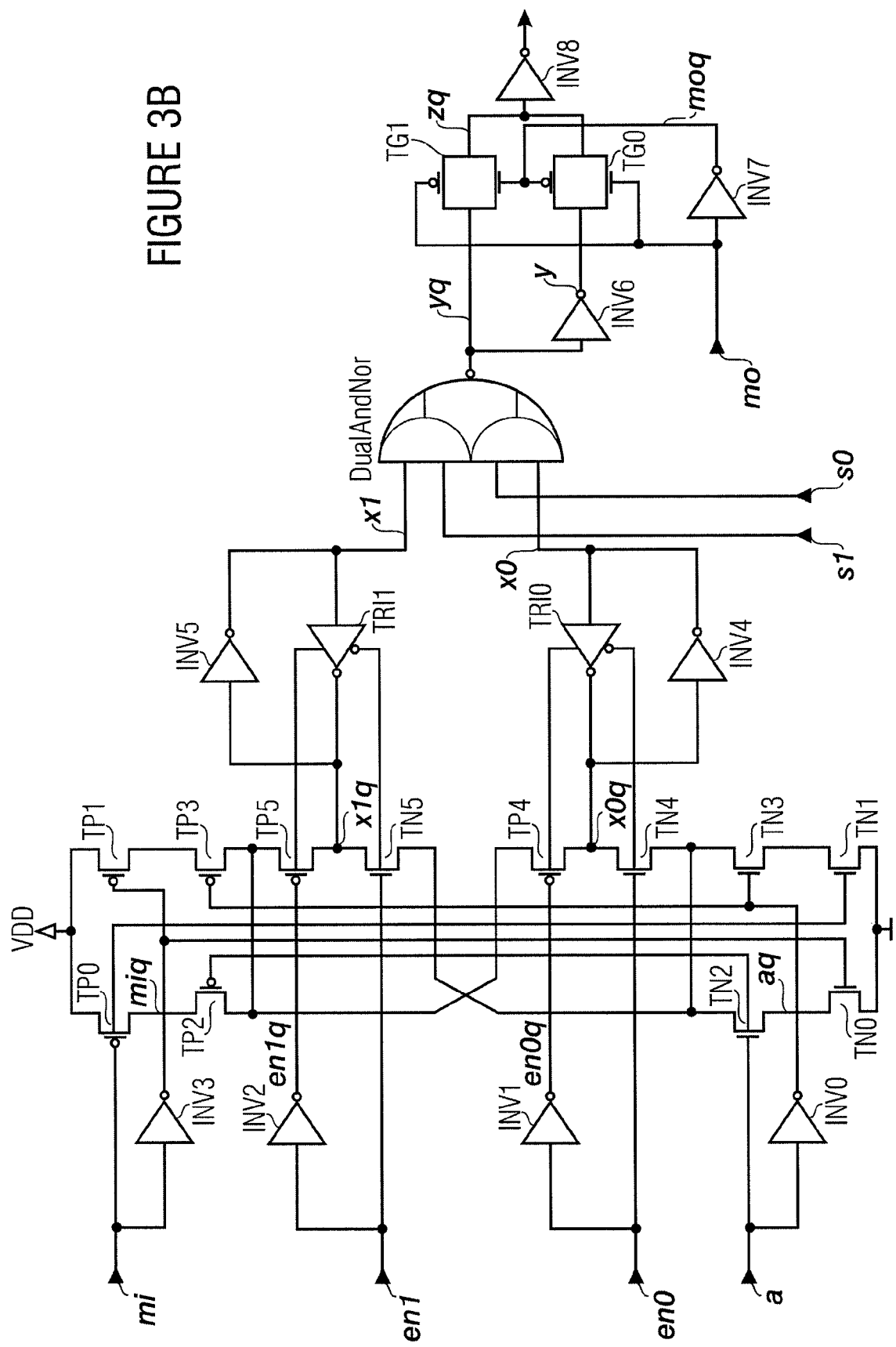
FIG. 3b shows an embodiment of a register file latch for masked data.

FIG. 3b shows an embodiment of a register file latch for masked data. FIG. 3b shows again two memory cells of a register file with separated write and read ports, where in the embodiment again one write and one read port are shown. The figure shows two in static CMOS-logic implemented latches, comprising INV5, TRI1 and INV4, TRI0, respectively, and the write ports TP5, TN5 and TP4, TN4, respectively, with the memory node pairs (x1, x1q) and (x0, x0q), respectively. Using the write ports TP5, TN5 and TP4, TN4, respectively, the memory cells are not directly connected to the data input a, as it was shown in FIG. 3a, but through another CMOS-transistor-network TP3. TP0 and TN3. TN0 as well as INV3 and INV0, carrying out an XOR-function. It is understood that there are many different ways to realize and/or implement XOR-functions, where the embodiments explained here are not to be considered limiting in any way.

The register file as depicted in FIG. 3b has similar components as the one shown in FIG. 3a. FIG. 3b shows the two XOR-functions, which ensure that for en=1 or en0=1, respectively, the value of $$a \oplus mi$$

is written into the latch having the memory nodes (x1, x1q) or (x0, x0q), respectively.

At the data input data a are provided and represent a clear text data d, which is masked with an OTP-transport-mask $m_t$ $$d \oplus m_t$$

which is to be re-masked during the writing operation, i.e., with $$mi = m_t \oplus m_s,$$

which is the result of the OTP-transport-mask $m_t$ XOR-operated to the storage mask $m_s$, $$a \oplus mi = d \oplus m_t \oplus mi = d \oplus m_t \oplus m_t \oplus m_s = d \oplus m_s,$$

which is actually stored in the memory cells and mi represents the mask which is provided from the external XOR-operation.

Reading data from the latches with the memory node pairs (x1, x1q) or (x0, x0q), respectively, is carried out through the DualAndNor-gate, which is used as multiplexer according to FIG. 3a. For (s1,s0)=(1,0) or (0,1), respectively, the values from x1 or x0, respectively, are provided to INV6 and INV8 as well as to the transmission gates TG1 and TG0 representing an XOR-gate for the data output z. Thus, $$z = (s1 \cdot x1 + s0 \cdot x0) \oplus mo.$$

Assuming that x1 and x0, respectively, are masked using the storage mask $m_s$ i.e., $d \oplus m$, and further assuming $$mo = m_t \oplus m_s,$$

it follows that for (s1, s0)=(1,0) or (s1, s0)=(0,1), respectively, the data output assumes the value of $$z = d \oplus m_t$$

i.e., data d being masked using the OTP-transport-mask $m_t$.

It is to be noted, that with the embodiment described above, clear text data is not present at any time or processing state, i.e. neither when writing data, nor during storage of the data within the latch cells, nor when reading out the data. Moreover, it is again assured that data masked with the mask $m_s$, which may be stored within the latch cells over longer time intervals is present only within the latch cells, where taking into account respective layout or circuit design options, satisfactory protection can be achieved. Again, data on data processors, for example, on a data input a are masked with the more frequently varying OTP-transport-mask $m_t$ rendering attacks much more difficult and requiring much more effort. Embodiments achieve this effect by the already mentioned integration of inverters INV0 and INV3, as well as the n-channel-transistors TP3 . . . TP0 and TN . . . TN0 establishing the XOR-function for each of the two latch cells.

Moreover, INV6, INV7 and INV8, as well as the transmission gates TG1 and TG0 establish another XOR-function at the data output z, enabling the above mentioned effect. According to layout considerations, the realization of the second XOR-function using the transmission gates seems advantageous when being used for two latch cells, although possibly a plurality of latch cells may be used, as for example one such XOR-function serving 4 or 8 latch cells. As known, XOR-functions can be realized using multiple implementations, where only some embodiments can be presented here. Generally, embodiments are not limited to the options chosen for the above described implementations.

The invention claimed is:

1. A memory cell for storing a binary state, the memory cell being adapted for storing a binary state based on a write indication and a binary write masking value and for storing a complementary binary state based on the write indication and a complementary binary write masking value.

2. The memory cell of claim 1 being further adapted for receiving a binary write value defining the binary state and for receiving a complementary binary write value defining the complementary binary state.

3. The memory cell of claim 2 being further adapted for receiving the binary write masking value and the complementary binary write masking value.

4. The memory cell of claim 1 being further adapted for providing a binary read value defining the binary state based on a read indication and a binary read masking value and for providing a complementary binary read value based on the read indication and a complementary binary read masking value.

5. The memory cell of claim 4 being further adapted for receiving a binary write value defining the binary state, a complementary binary write value, a binary write masking value and a complementary binary write masking value.

6. The memory cell of claim 1 comprising a Random Access Memory or a register file latch.

7. The memory cell of claim 1 comprising a switch coupled to a masking device or masking transistor, the masking transistor adapted for determining the binary state based on the binary write masking value or the complementary binary write masking value, wherein the switch is adapted for coupling the masking transistor to the memory cell or to another memory cell.

* * * * *